United States Patent [19]

Ciparisso

[11] Patent Number: 4,485,124
[45] Date of Patent: Nov. 27, 1984

[54] EVAPORATION OF BLOOMING LAYERS ONTO OPTICAL SUBSTRATES

[75] Inventor: Delio Ciparisso, Ascona, Switzerland

[73] Assignee: Satis Vacuum AG, Zürich, Switzerland

[21] Appl. No.: 296,806

[22] Filed: Aug. 27, 1981

[30] Foreign Application Priority Data

Sep. 3, 1980 [CH] Switzerland .................. 6621/80

[51] Int. Cl.³ .................................... B05D 5/06
[52] U.S. Cl. .................................... 427/55; 427/164; 427/42
[58] Field of Search ................... 427/55, 164, 42

[56] References Cited

FOREIGN PATENT DOCUMENTS 2658417 6/1978 Fed. Rep. of Germany .

Primary Examiner—John H. Newsome
Attorney, Agent, or Firm—Karl F. Ross

[57] ABSTRACT

Optical substrates are coated with blooming layers. The substrate is placed into a vacuum vessel, the vessel is evacuated and the substrate is subjected to infrared radiation before and during the evaporation process. The substrate can be a plastic material and is preferably polydiethylene-glycol-diallyl-carbonate. Preferably initially a thin layer of high-refractive index silicon monoxide and then a second thicker, lower-refractive index silica are deposited. The resulting optical articles such as eye-glasses and watch glasses have excellent properties.

7 Claims, 1 Drawing Figure

U.S. Patent    Nov. 27, 1984    4,485,124
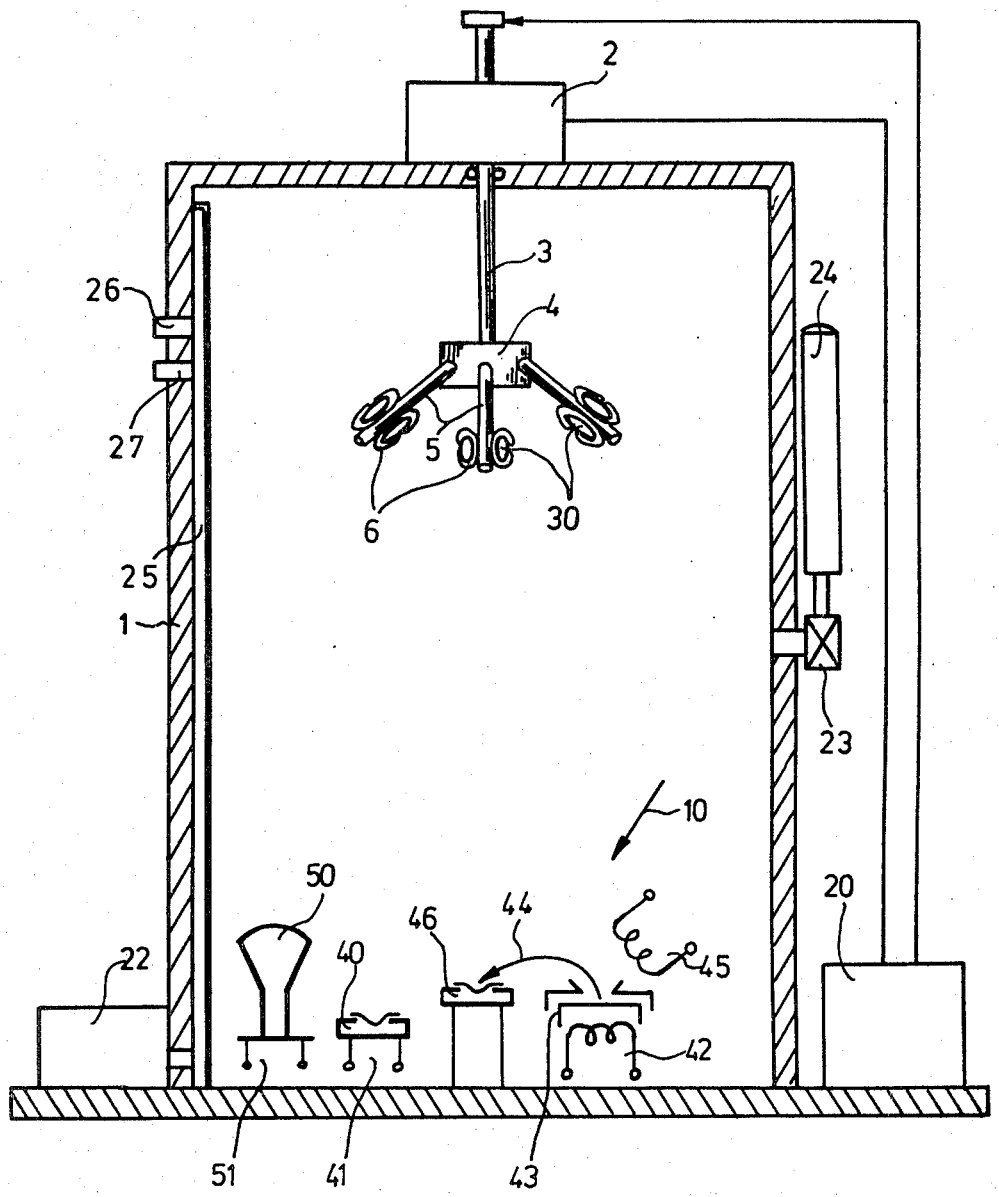

EVAPORATION OF BLOOMING LAYERS ONTO OPTICAL SUBSTRATES

FIELD OF THE INVENTION

The present invention relates to a process for depositing of blooming layers onto transparent substrates such as optical articles from plastics, in particular of polydiethylene-glycoldiallylcarbonate, in vacuum where the layer forming evaporated materials are disposed in a vacuum vessel together with the substrates to be coated.

BACKGROUND OF THE INVENTION

It is generally known that there are considerable problems involved in the application of blooming layers onto transparent plastic substrates as well as the preparation of antireflection coatings.

In appplicant's copending U.S. application Ser. No. 150,239 (now abandoned) it was determined in this context that the thermal expansion of plastics is about 200 times larger than the thermal expansion of conventional coating materials. It was further determined that even after the most careful purification in vacuum thin water skins or other traces remain on the surfaces of the substrates to be coated, which skins are only several atomic layers thick.

On the other hand it was found in German patent application De-OS No. 26 58 417 that the polydiethylene-glycol-diallyl-carbonate designated as CR-39 is very desirable as a transparent substrate for optical articles based on its optical properties and its relative hardness.

For this purpose in the above-mentioned application it was disclosed that in this case there are numerous problems also in the selection of suitable evaporating materials and that at least a double layer has to be constructed comprising a high-refractive index material and a lower-refractive index material in order to meet all requirements which have to be imposed on such blooming layers. In this context it has to be noted that the optical waves reflected at the air-evaporated-layer/-substrate boundary do extinguish by interference. First, the layer has to meet the so-called index condition, which prescribes the index of refraction of the layer and which endures that the amplitudes of the two waves become the same. Second, the layer has to meet the phase condition, which requires a layer of a certain thickness so that the phase inversion occurs, which is required for the mutual extinction. It is a further requirement that these layers have to be hard and they have to hold up well and they should be well attached. In addition, the layers should be resistant to mechanical wear and to atmospheric influences. Finally, the layers have to be resistant to aging and are not to react with the oxygen of the air, since otherwise stains might form.

In order to meet these requirements the above-mentioned application teaches initially to treat the substrate surfaces to be bloomed with an electron beam and then to coat the thus cleaned surface with a first layer of silicon monoxide, a second layer of hafnium oxide and a third layer of silica.

These procedures have achieved coating qualities which had not been reached previously. However, such coated materials were not able to meet optimally all conditions to be imposed on high-use eye-glasses or watch glasses.

OBJECTS OF THE INVENTION

It is an object of the present invention to provide a method of producing highly wear resistant reflection-coated optical articles.

It is another object of the present invention to provide a method of coating plastic materials and in particular for polydiethylene-glycol-diallyl-carbonate substrates, which meets all the requirements for heavily used eye-glasses and watch glasses.

It is a further object to provide a method of coating optical organic materials, which does not crack and functions as an anti-reflection coating.

SUMMARY OF THE INVENTION

The apparatus for carrying out the evaporation of coatings onto substrates comprises a rotatable, cup-shaped sample holder disposed in a vacuum vessel and is capable of supporting at least one substrate. A source of infrared radiation is directed toward the substrate. A controlled source of oxygen is provided to the vacuum vessel and sources of silicon and of silica are disposed in the vacuum vessel. An electronic control system is provided for operating the sample holder and substrate and a vacuum pump is provided for evacuating the vacuum vessel.

An electron beam generator can be provided in the vacuum vessel for evaporation of the silica. A heat exchange means can be provided for adjusting the temperature of the vacuum vessel.

The method for coating blooming layers onto optical substrates comprises placing the substrates into a vacuum vessel, evacuating the vaccum vessel and subjecting the substrates to infrared radiation before and during the coating. Preferably the coating is provided by an evaporated material such as a plastic material, for example polydiethylene-glycol-diallyl-carbonate. Preferably, at least two different layers of oxidized silicon are successively evaporated onto the substrate (i.e. the substrate is vapor-deposited with these layers) during the application of the infrared radiation. A first high-refractive index layer of silicon monoxide (SiO) and then a lower-refractive index layer of different thickness of silica ($SiO_2$) can be evaporated onto the substrate. The first layer can be evaporated up to a thickness from about 0.005 micron to 0.015 micron and the second layer up to a thickness from about 0.3 to 0.45 micron.

Further there is provided an optical article which comprises a substrate from an organic material and a blooming layer covering the substrate and comprising oxidized silicon. The substrate can be from a plastic material and is preferably from polydiethylene-glycol-diallyl-carbonate. The substrate can be formed as an eye-glass or as a watch glass. The blooming layer can comprise two adjacent layers of differing thickness and different composition of oxidized silicon. The first layer adjacent to the substrate can comprise high-refractive index material of silicon monoxide (SiO) and the second outer layer adjacent to the silicon monoxide can comprise a lower-refractory index material of silica of a different thickness. Preferably the first layer from silicon monoxide (SiO) has a thickness of about 0.005 micron to 0.015 micron and the second outer layer of silica has a thickness of about 0.3 to 0.45 micron.

BRIEF DESCRIPTION OF THE DRAWING

The sole FIGURE of the accompanying drawing, showing one of the various possible embodiments of the present invention, is a schematic view of a section of the coating apparatus.

SUMMARY OF THE INVENTION

In accordance with the present invention, the objects and substrates to be coated are subjected to infrared radiation in a vacuum vessel at least before and during the deposition phase. Preferably a direct infrared source is employed.

As has been found in long term tests it is now possible by these means to provide a surface exceptionally prepared for the deposition of a suitable evaporation material. The infrared radiation effects a complete destruction and dissolution of the surface water skin and allows for such a surface expansion of the substrate to be deposited, which does not occur again during the later use of the substrate such that a later cracking of the deposited coating can be excluded.

An optimal coating is achieved if during the infrared irradiation two differing layers of oxidized silicon are deposited onto the objects. It is advantageous, if a first high-refractive index layer from a silicon monoxide (SiO) is applied to the object and then a second lower-refractive index layer of differing thickness of silica ($SiO_2$) is deposited.

Tests have shown that the layer thicknesses have to relate to each other in a particular and accurate ratio, which is provided in accordance with the present invention by having a first layer up to a thickness of at least about 1/12 of lambda-quarter (a quarter wavelength) and the second layer up to a thickness of at least about three quarters of lambda (¾ wavelength), in each case as referred to the wavelength of visible light, for which the human eye shows the highest sensitivity.

In addition, the present invention relates to an optical article and in particular to eye-glasses or watch glass comprising a substrate from plastic and in particular the polydiethylene-glycol-diallyl-carbonate known under the designation CR-39 having blooming layers produced in accordance with the present invention.

In accordance with the invention, the optical article is distinguished by two blooming layers of differing thickness and differing material comprising oxidized silicon. This structure is characterized by a first inner high-refractive index layer from a silicon monoxide (SiO) and by a second outer layer adjacent to the first layer of a lower refractive index silica ($SiO_2$) with a differing thickness. It is important that the first inner layer of silicon monoxide (SiO) has a layer thickness of about at least 1/12 (one twelfth) of lambda-quarter and that the second outer layer of silica ($SiO_2$) has a layer thickness of at least about ¾ (three quarters) lambda, in each case as referred to the wavelength of the visible light for which the human eye has the highest sensitivity.

In addition, the present invention relates to a vacuum evaporation apparatus for evaporation of optical blooming layers onto optical substrates, in particular eye-glasses or watch glasses, comprising plastic compositions and in particular polydiethylene-glycol-diallyl-carbonate. A rotary cup-shaped sample holder for a clamping of the substrate and preferably providing for its turning sides, and more preferred for a plurality of substrates, is disposed under a bell-jar. The evaporating materials are disposed in heatable boats or in boats exposable to the electron beam of an electron beam gun placed on the base plate of the vacuum vessel.

In accordance with the present invention, this apparatus is characterized by having on the base plate of the vacuum vessel or close to the base plate at least one infrared radiation source disposed and the heat radiation from the infrared source is directed immediately to the bottom side of the sample holder or the objects mounted there.

Vacuum evaporators are known and various constructions have been described. Referring now to the FIGURE there is shown a vacuum vessel 1 containing one or more evaporation sources 10. Depending on the positions of the sources the substrates are generally coated from below but also at times from above. Since there is the danger during the evaporation that particles fall or are splashed from the evaporator material source and contaminate the surfaces to be coated, it is preferred to employ the safer operation with coating from below. This mode of operation requires however for a two-side coating a turning around of the objects. For this purpose the sample holder 4 comprises turn supports for the substrates. The articles to be coated such as for example optical lenses, filters, mirrors and the like and in particular plastic eye-glasses 30 are in general mounted to a rotary, cup-shaped sample holder 4 with a plurality of turn supports 5, 6. In a conventional way there are also provided in the vacuum vessel diaphragm provisions for controlling the deposition field and/or for covering one or more of the evaporation sources during the turning of the substrate support. Such diaphragms are not shown in the drawing. In order to operate or respectively run the apparatus parts to be moved within the vacuum vessel provisions are required with actuating feed throughs reaching from the outside into the vacuum vessel such as for example the rotary mechanism 3 with the motor 2 for the sample holder 4. All these provisions are in general controlled from a control section 20.

The inner volume of the vacuum vessel is furthermore connected to a vacuum pump 22 and to an oxygen source 23 via a valve 24.

In addition, the inner wall of the vacuum vessel 1 is provided with coiled conduits 25, which end on the outside into a connecting sleeve 26 for cold water and into a connecting sleeve 27 for hot water.

The evaporation source 10 diposed on the base plate 21 of the vacuum vessel comprises a first boat 40 with the current connections 41 to provide electrical heat. This boat 40 contains the first mentioned evaporation material that is pure silicon (Si).

The evaporation source 10 comprises furthermore a so-called electron beam gun with a heating wire 42, the electrons emanating from the gun being converged to a beam by focussing means. For example, the electron beam can be generated from a tungsten cathode connected to a negative high voltage and the electrons can be prefocussed with a correspondingly shaped Wehnelt-cylinder. This electron beam 44 can now be redirected with a redirecting magnetic means 45 into another boat 46 containing the second evaporation material that is silica ($SiO_2$). Of course also another method of heating can be employed such as for example inductive heating resulting in evaporation.

Furthermore, the infrared radiation source 50 according to the present invention together with its power connections 51 is mounted such to the base plate 10 of the vacuum vessel 1 that its thermal radiation directly hits the lower side of the objects 30 to be coated.

In this connection means not shown here can be provided to bundle the infrared light additionally or to amplify the same. Furthermore any desired infrared radiation source can be employed and also more than one infrared source can be provided.

EXAMPLE

Initially the objects 30 after precleaning, several hours of degassing at 95° C. and a vacuum of $10^{-1}$ Torr and an ultrasonic aftercleaning are inserted into the turn supports 5,6 of the cup-shaped sample holder 4 for obtaining the desired quality. The blooming layers are evaporated onto for example eye-glasses from the mentioned polydiethylene-glycol-diallyl-carbonate.

Then the vacuum cycle was started with simultaneous preheating by introduction of warm water into the heat exchanger 25 for a time of about 20 to 25 minutes.

Then the infrared heating was started onto the objects 30 now rotating with the sample holder 4. This infrared irradiation was maintained to the termination of the vacuum cycle.

After about 20 minutes of the infrared irradiation and at a vacuum of $2 \times 10^{-4}$ Torr then the objects 30 were flushed for about 4 minutes with pure oxygen allowed to enter by opening the valve 23.

Then the temperature in the interior of the vacuum chamber was lowered by feeding cold water into the heat exchanger 25 and the objects 30 were again flushed for four minutes with pure oxygen ($O_2$).

Then the evaporation of the first layer was performed by switching on the thermal evaporator 40, 41. In this connection slow increase in temperature provided a gettering by binding residual gas molecules based on a chemical reaction with the residual gas molecules, which improved the vacuum to $5 \times 10^{-6}$ Torr. It was also found that the deposited silicon monoxide could enter such a strong bond with the object surface, optimally dried and heated under the effect of the infrared radiation, that it was able to hold up to all conventional tests.

It was further found to be particularly advantageous to allow the first deposited layer, which was of a thickness of 1/12 of lambda-quarter as referred to the wavelength of such visible light for which the human eye exhibits maximum sensitivity, to rest for about two minutes to allow for an optimal oxidation.

Then the second layer of silica of a thickness of ¾ lambda, as referred to the wavelength of the visible light for which the human eye is most sensitive, was deposited by switching on the electron beam evaporator 42–46.

Then the infrared radiation source 50, 51 was turned off and the vacuum vessel was flooded after a dwell time of a few minutes and the now bloomed objects 30 were removed.

Detailed measurements and tests have shown that the objects bloomed in the way described above provide an optical and mechanical quality not reached before and that they meet all requirements imposed. In particular such an object is at least equal in the anti-reflection efficiency to a simple layer onto eye-glasses from crown-glass.

Thus the present invention provides a considerable expansion for the range of application of optical articles made from plastics.

It thus will be seen that there is provided a device and method which achieves the various objects of the invention and which is well adapted to practical use.

As various possible embodiments might be made of the present invention, and as various changes might be made in the embodiment above set forth, it is to be understood that all matter herein described or shown in the accompanying drawing is to be interpreted as illustrative and not in a limiting sense.

I claim:

1. A method of coating blooming layers onto optical substrates comprising the steps of:
   placing a substrate into a vacuum vessel;
   evacuating the vacuum vessel;
   treating the substrate to infrared radiation; and
   vapor deposition coating blooming layers onto the infrared radiation treated substrate, the infrared radiation treatment continuing during coating.

2. The method of coating according to claim 1 wherein the coating is provided by an evaporated material.

3. The method of coating according to claim 2 wherein the optical substrate is a plastic material.

4. The method of coating according to claim 2 wherein the substrate is from polydiethylene-glycol-diallyl-carbonate.

5. The method of coating according to claim 2 further comprising evaporating onto the substrate during the operation of the infrared radiation at least two different layers of oxidized silicon.

6. The method of coating according to claim 2 further comprising
   evaporating onto the substrate a first high-refractive index layer of silicon monoxide (SiO) and then a second low-refractive index layer of different thickness from silica ($SiO_2$).

7. The method of coating according to claim 6 further comprising
   evaporating the first layer up to a thickness of from about 0.005 micron to 0.015 micron and the second layer up to a thickness of from about 0.3 to 0.45 micron.

* * * * *